United States Patent
Fan et al.

(10) Patent No.: US 9,905,488 B2
(45) Date of Patent: Feb. 27, 2018

(54) ARRAY SUBSTRATE, METHOD FOR MANUFACTURE THE SAME, AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu, Sichuan (CN)

(72) Inventors: Haoyuan Fan, Beijing (CN); Yanxia Xin, Beijing (CN); Yuqing Yang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 14/908,455

(22) PCT Filed: Sep. 11, 2015

(86) PCT No.: PCT/CN2015/089445
§ 371 (c)(1),
(2) Date: Jan. 28, 2016

(87) PCT Pub. No.: WO2016/150114
PCT Pub. Date: Sep. 29, 2016

(65) Prior Publication Data
US 2017/0040236 A1 Feb. 9, 2017

(30) Foreign Application Priority Data
Mar. 20, 2015 (CN) .......................... 2015 1 0125812

(51) Int. Cl.
*H01L 23/58* (2006.01)
*H01L 29/04* (2006.01)
(Continued)

(52) U.S. Cl.
CPC .......... *H01L 22/32* (2013.01); *H01L 27/1244* (2013.01); *H01L 27/1259* (2013.01); *H01L 22/14* (2013.01)

(58) Field of Classification Search
CPC . H01L 22/32; H01L 27/1244; H01L 27/1259; H01L 22/14
(Continued)

(56) References Cited

U.S. PATENT DOCUMENTS 6,043,971 A * 3/2000 Song ................. G02F 1/136204
349/40
2002/0027621 A1* 3/2002 Chae .................... G02F 1/13458
349/40

(Continued)

FOREIGN PATENT DOCUMENTS

CN 101615606 A 12/2009
CN 101846858 A 9/2010

(Continued)

OTHER PUBLICATIONS

English Machine Translation Chinese Patent Application CN 104298039.*

(Continued)

*Primary Examiner* — Dzung Tran
(74) *Attorney, Agent, or Firm* — Harness, Dickey & Pierce, P.L.C.

(57) ABSTRACT

The present disclosure provides an array substrate, its manufacturing method and a display device. The array substrate includes operating circuit interfaces, testing interfaces, and testing lines connecting the operating circuit interfaces and (Continued)

the testing interfaces. Each testing line includes at least one cut-off point, and conductive contacts extending to an upper surface of the array substrate are arranged at two sides of each cut-off point of the testing line. When testing an operating circuit, electrically connecting the conductive contacts at two sides of each cut-off point enables the testing line to be conductive.

20 Claims, 6 Drawing Sheets

(51) Int. Cl.
  *H01L 27/12* (2006.01)
  *H01L 21/70* (2006.01)
  *H01L 21/66* (2006.01)
(58) Field of Classification Search
  USPC ............ 257/48, 59, 350, 368, 415, E23.002; 438/18
  See application file for complete search history.

(56) References Cited

U.S. PATENT DOCUMENTS

| | | | |
|---|---|---|---|
| 2005/0000071 A1* | 1/2005 | Huntington | H01G 9/0029 29/25.42 |
| 2010/0140615 A1* | 6/2010 | Li | G09G 3/006 257/48 |
| 2011/0074729 A1* | 3/2011 | Im | G06F 3/0412 345/174 |
| 2014/0267191 A1* | 9/2014 | Takahara | H01L 27/323 345/179 |
| 2014/0346511 A1 | 11/2014 | Wu et al. | |
| 2017/0040236 A1 | 2/2017 | Fan et al. | |

FOREIGN PATENT DOCUMENTS

| | | |
|---|---|---|
| CN | 102012593 | 4/2011 |
| CN | 202917490 U | 5/2013 |
| CN | 104298039 A | 1/2015 |
| CN | 104701327 A | 6/2015 |
| JP | 2001291852 A | 10/2001 |

OTHER PUBLICATIONS

First Office Action regarding Chinese Application No. 201510125812.3, dated Mar. 28, 2017. Translation provided by Dragon Intellectual Property Law Firm.

International Search Report and Written Opinion of the International Searching Authority for International Application No. PCT/CN2015/089445, dated Dec. 16, 2015. Translation provided by Dragon Intellectual Property Law Firm.

Second Office Action regarding Chinese Application No. 201510125812.3, dated Sep. 5, 2017. Translation provided by Dragon Intellectual Property Law Firm.

* cited by examiner

ARRAY SUBSTRATE, METHOD FOR MANUFACTURE THE SAME, AND DISPLAY DEVICE

CROSS-REFERENCE TO RELATED APPLICATIONS

The present application is the U.S. national phase of PCT Application No. PCT/CN2015/089445 filed on Sep. 11, 2015, which claims a priority of the Chinese patent application No. 201510125812.3 filed on Mar. 20, 2015, the disclosures of both of which are incorporated herein by reference in theft entirety.

TECHNICAL FIELD

The present disclosure relates to the field of display technology, in particular to an array substrate, a method for manufacturing the same and a display device.

BACKGROUND

As an important component of a display device, an array substrate includes operating circuits at both a display region and a peripheral region. Currently, for some array substrates with complex structures, e.g., a low temperature poly-silicon (LTPS) array substrate, it is necessary to perform relevant testing on the operating circuits at a production stage.

SUMMARY

An object of the present disclosure is to provide an array substrate, a method for manufacturing the array substrate and a display device, so as to prevent the operating circuits from being damaged when too many charges are accumulated at elongate testing lines due to an antenna effect.

In one aspect, the present disclosure provides in some embodiments an array substrate, including operating circuit interfaces, testing interfaces, and testing lines connecting the operating circuit interfaces and the testing interfaces. Each testing line includes at least one cut-off point, and conductive contacts extending to an upper surface of the array substrate are arranged at two sides of each cut-off point of the testing line.

Alternatively, at least one of the testing lines includes a cut-off point at its midpoint.

Alternatively, at least one of the testing lines includes cut-off points at its two ends.

Alternatively, the conductive contact is a via-hole extending from one side of the cut-off point to the upper surface of the array substrate, and a conductive material is arranged in the via-hole and extends to the upper surface of the array substrate.

Alternatively, a distance between the conductive contacts at two sides of each cut-off point is greater than 5 µm.

Alternatively, the conductive contacts at two sides of each cut-off point are electrically connected to each other through a silver conductive adhesive.

Alternatively, each testing line is segmented by the at least one cut-off point into a plurality of testing sub-lines arranged at an identical layer or at different layers of the array substrate.

Alternatively, the operating circuit interfaces include an operating circuit interface at a display region and an operating circuit interface at a peripheral region, the testing interfaces include a testing interface at the display region and a testing interface at the peripheral region, the testing lines include a testing line at the display region and a testing line at the peripheral region, the testing line at the display region connects the operating circuit interface at the display region to the testing interface at the display region, and the testing line at the peripheral region connects the operating circuit interface at the peripheral region to the testing interface at the peripheral region.

In another aspect, the present disclosure provides in some embodiments a method for manufacturing an array substrate, including steps of: forming, on a substrate, testing lines each including at least one cut-off point, two ends of each testing line being connected to an operating circuit interface and a testing interface respectively; forming, at two sides of each cut-off point of the testing line, conductive contacts extending to an upper surface of the array substrate; and electrically connecting the conductive contacts at two sides of each cut-off point to each other when testing an operating circuit, so as to enable each testing line to be conductive.

Alternatively, at least one of the testing lines includes a cut-off point at its midpoint.

Alternatively, at least one of the testing lines includes cut-off points at its two ends.

Alternatively, each conductive contact is a via-hole in which a conductive material is provided, and the step of forming, at two sides of each cut-off point of each testing line, the conductive contacts extending to the upper surface of the array substrate includes forming, at two sides of each cut-off point of each testing line, the via-holes extending to the upper surface of the array substrate, and providing the conductive material in each via-hole, the conductive material extending to the upper surface of the array substrate.

Alternatively, a distance between the conductive contacts at two sides of each cut-off point is greater than 5 µm.

Alternatively, the step of electrically connecting the conductive contacts at two sides of each cut-off point includes electrically connecting the conductive contacts at two sides of each cut-off point through a silver conductive adhesive.

Alternatively, the step of forming, on the substrate, the testing lines each including at least one cut-off point includes forming, on the substrate, the testing lines each including at least one cut-off point and a gate electrode pattern, or forming, on the substrate with an insulation layer, the testing lines each including at least one cut-off point and a source-drain electrode pattern.

Alternatively, the step of forming, on the substrate, the testing lines each including at least one cut-off point includes: forming, on the substrate, a first testing sub-line pattern and a gate electrode pattern, forming, on the substrate with the first testing sub-line pattern and the gate electrode pattern, an insulation layer, and forming, on the substrate with the insulation layer, a second testing sub-line pattern and a source-drain electrode pattern, the first testing sub-line pattern and the second testing sub-line pattern being formed together as the testing line including at least one cut-off point.

Alternatively, the operating circuit interfaces include an operating circuit interface at a display region and an operating circuit interface at a peripheral region, the testing interfaces include a testing interface at the display region and a testing interface at the peripheral region, the testing lines include a testing line at the display region and a testing line at the peripheral region, the testing line at the display region connects the operating circuit interface at the display region to the testing interface at the display region, and the testing line at the peripheral region connects the operating circuit interface at the peripheral region to the testing interface at the peripheral region.

In yet another aspect, the present disclosure provides in some embodiments a display device including the above-mentioned array substrate.

According to the embodiments of the present disclosure, when forming each testing line, each testing line is provided with at least one cut-off point in such a manner that the segmented testing sub-lines are each not too long. As a result, it is able to attenuate an antenna effect generated when the testing line is too long, thereby to prevent the operating circuits from being damaged when too many charges are accumulated at the elongate testing lines due to the antenna effect.

It should be appreciated that, the above and the following descriptions are for illustrative and explanatory purposes only, but shall not be used to limit the scope of the present disclosure.

BRIEF DESCRIPTION OF THE DRAWINGS

The following drawings are incorporated into and form a part of the specification, so as to show the embodiments of the present disclosure and explain the principle of the present disclosure in conjunction with the specification.

Figure 1:
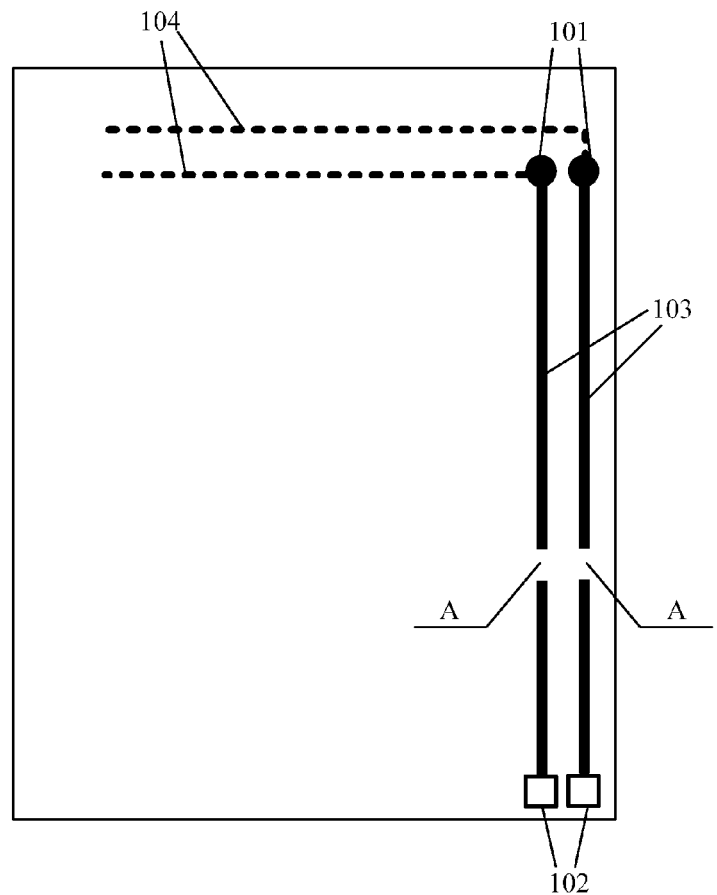
FIG. 1 is a schematic view showing an array substrate according to one embodiment of the present disclosure.

The specific embodiments of the present disclosure are shown by the above-mentioned drawings, and more details will be given hereinafter. These drawings and the descriptions thereof are used to facilitate the understanding of the present disclosure with reference to the specific embodiments, rather than to limit the scope of the present disclosure in any ways.

DETAILED DESCRIPTION OF THE EMBODIMENTS

The present disclosure will be described hereinafter in conjunction with the drawings and embodiments. Unless otherwise defined, identical numerals in the drawings represent an identical or similar element. It should be appreciated that, the following embodiments are for illustrative purposes only, but shall not be used to limit the scope of the present disclosure.

It is found that, an array substrate includes testing lines. Each testing line is configured to connect an operating circuit interface (which is electrically connected to an operating circuit) at an end of the array substrate in a lengthwise direction and a testing interface at the other end of array substrate in the lengthwise direction. During the testing, a testing signal is directly inputted to the each testing line via the testing interface. Each testing line is connected to the operating circuit, so it is able to test the operating circuit.

In order to test the array substrate in an effective manner, each testing line is usually too long, and too many charges may be accumulated due to an antenna effect generated by the elongate testing line. The operating circuit may be damaged by these charges.

As shown in FIG. 1, which is a schematic view showing an array substrate according to one embodiment of the present disclosure, the array substrate may include testing lines 103 each configured to connect an operating circuit interface 101 and a testing interface 102. Each testing line 103 includes at least one cut-off point A, and conductive contacts (not shown in FIG. 1) extending to an upper surface of the array substrate are arranged at two sides of each cut-off point of the testing line 103.

When testing the operating circuit 104, the conductive contacts at two sides of each cut-off point are electrically connected to each other, so as to electrically connect testing sub-lines of each testing line.

According to the array substrate in the embodiments of the present disclosure, when forming each testing line, each testing line is provided with at least one cut-off point in such a manner that the segmented testing sub-lines are each not too long. As a result, it is able to attenuate an antenna effect generated when the testing line is too long, thereby to prevent the operating circuits from being damaged when too many charges are accumulated at the elongate testing lines due to the antenna effect.

Figure 2:
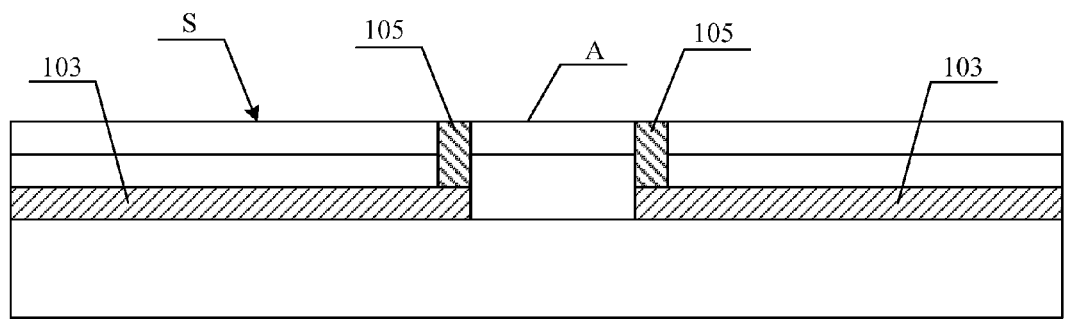
FIG. 2 is a left-side sectional view of the array substrate at a cut-off point in FIG. 1.

As shown in FIG. 2, which is a left-side sectional view of the array substrate at the cut-off point A in FIG. 1, the conductive contacts 105 extending to the upper surface S of the array substrate are arranged at two sides of each cut-off point A of the testing line 103.

Figure 3:
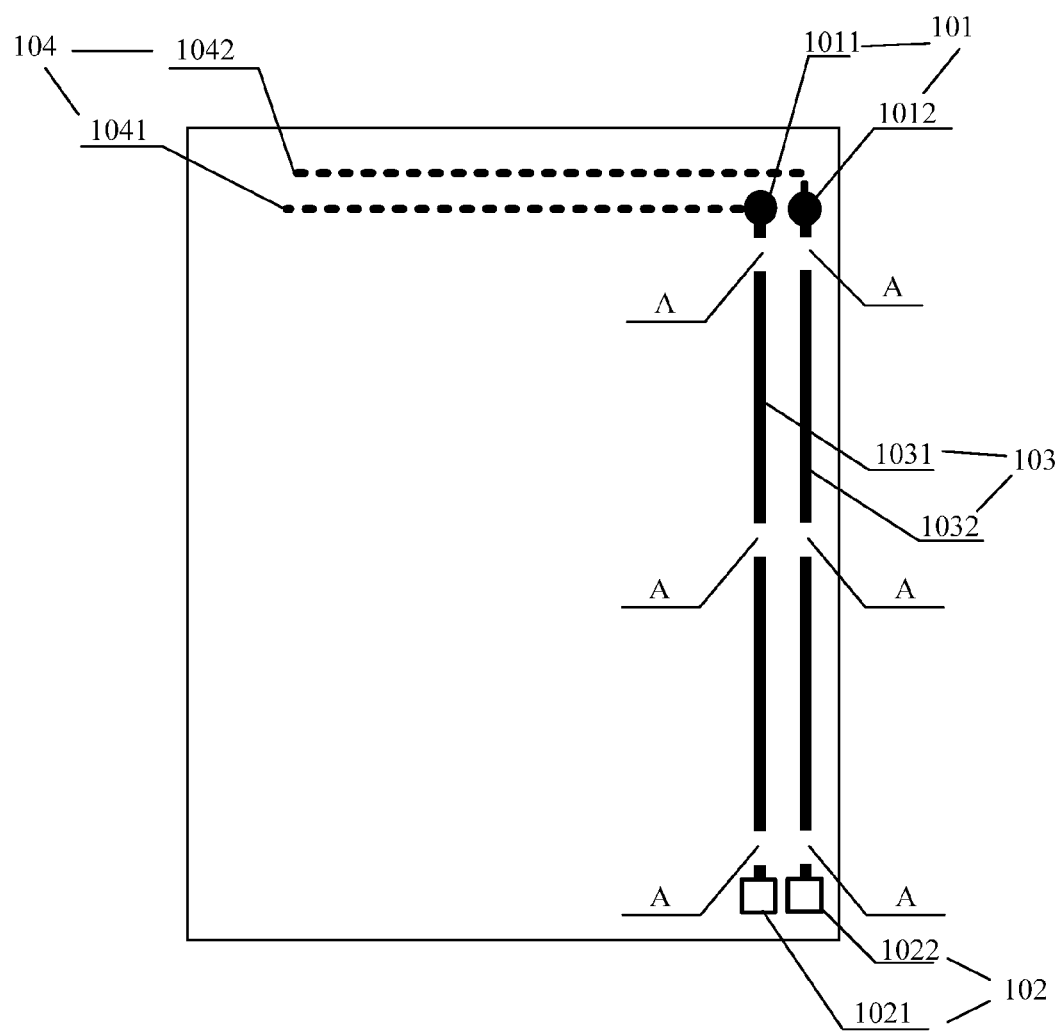
FIG. 3 is another schematic view showing the array substrate according to one embodiment of the present disclosure.

Further, as shown in FIG. 3, which is another schematic view showing an array substrate according to one embodiment of the present disclosure, the array substrate includes additional members as compared with the array substrate in FIG. 1, so as to improve the performance of the array substrate.

The operating circuit interfaces 101 include an operating circuit interface 1011 at a display region and an operating circuit interface 1012 at a peripheral region. The testing interfaces 102 include a testing interface 1021 at the display region and a testing interface 1022 at the peripheral region. The testing lines 103 include a testing line 1031 at the display region and a testing line 1032 at the peripheral region. Each testing interface 102 may be an indium tin oxide (ITO) interface and arranged at an ITO layer. It should be appreciated that, a position of each testing interface is not particularly defined herein, and during the actual application, its position is adjustable.

The testing line 1031 at the display region connects the operating circuit interface 1011 at the display region to the testing interface 1021 at the display region; and the testing line 1032 at the peripheral region connects the operating circuit interface 1012 at the peripheral region to the testing interface 1022 at the peripheral region.

It should be appreciated that, the testing line 1031 at the display region and the testing line 1032 at the peripheral region may include the cut-off points at an identical position or at different positions. In addition, the testing lines 103 may further include any other lines for testing the other operating circuits, which is not particularly defined herein.

Optionally, at least one of the testing lines 103 includes the cut-off point A at its midpoint, i.e., the at least testing line 103 is divided by the cut-off point A into two testing sub-lines with an identical length. As a result, it is able to remarkably attenuate the antenna effect generated by the testing line through the only one cut-off point A at the midpoint. Optionally, at least one of the testing lines 103 includes the cut-off points A at both ends, and the testing line is separated from the operating circuit through the cut-off points A, so as to prevent the charges accumulated in the testing line due to the antenna effect from be introduced into the operating circuit. To be specific, the testing line 1031 at the display region and the testing line 1032 at the peripheral region may each include at least one cut-off point A. Alternatively, the cut-off points A may be provided at a midpoint of the testing line 1031 at the display region and a midpoint of the testing line 1032 at the peripheral region. Further, the cut-off points A may also be provided at both ends of the testing line 1031 at the display region and at both ends of the testing line 32 at the peripheral region.

Figure 4:
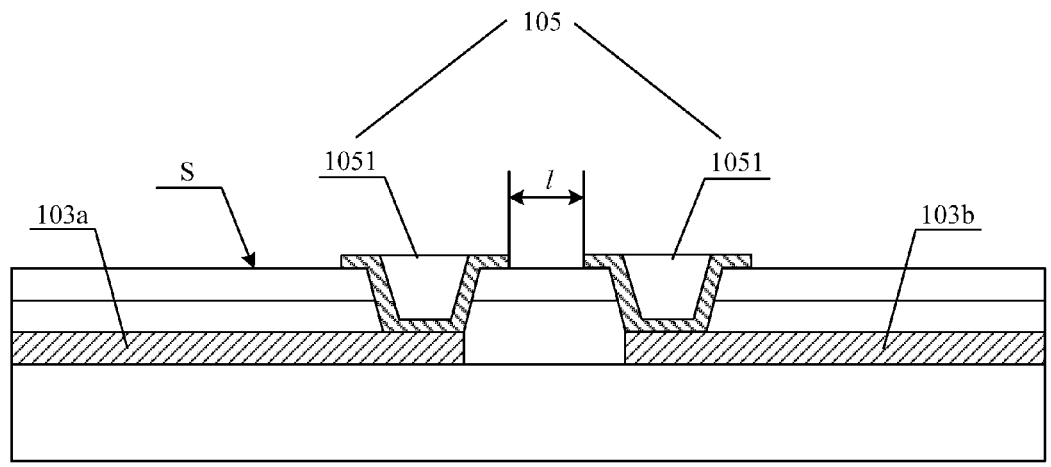
FIG. 4 is a left-side sectional view of the array substrate at a cut-off point in FIG. 3.

Alternatively, as shown in FIG. 4, which is a left-side sectional view of the array substrate at the cut-off point A in FIG. 3, each conductive contact 105 is a via-hole extending from one side of the cut-off point to the upper surface S of the array substrate, and conductive material 1051 is provided in the via-hole and extends to the upper surface of the array substrate. A distance between the conductive contacts at two sides of each cut-off point is greater than 5 μm. The conductive material 1051 may be metal or ITO.

The conductive contacts at two sides of each cut-off point may be electrically connected to each other through a silver conductive adhesive (an adhesive with a conductive property after being dried). For example, when it is necessary to test the operating circuit using the testing line, the silver conductive adhesive may be dripped at each cut-off point, so as to connect the conductive contacts at two sides of the cut-off point. It should be appreciated that, the conductive contacts at two sides of each cut-off point may also be connected to each other by welding.

Alternatively, each testing line is segmented by the at least one cut-off point into a plurality of testing sub-lines arranged at an identical layer or at different layers of the array substrate. In FIG. 4, the testing sub-lines segmented by the cut-off points A are arranged at an identical layer of the array substrate, i.e., a testing sub-line 103a and a testing sub-line 103b are arranged at an identical layer. For example, each testing line may be arranged at a layer identical to a gate line pattern or a source-drain electrode pattern.

Figure 5:
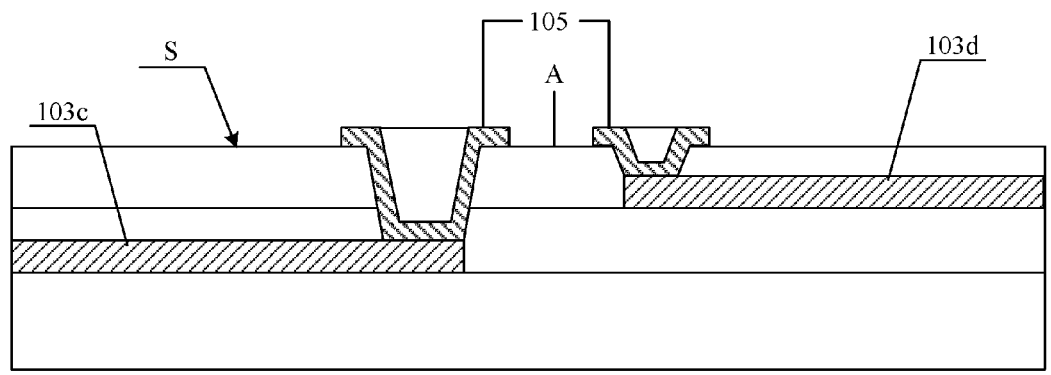
FIG. 5 is a schematic view showing the array substrate in FIG. 3 where a plurality of testing sub-lines are arranged at different layers.

As shown in FIG. 5, which is a schematic view showing the array substrate where the testing sub-lines are arranged at different layers. The testing sub-line formed on a substrate may be referred to a first testing sub-line, and the testing sub-line formed on an insulation layer may be referred to a second testing sub-line. A first testing sub-line 103c and a second testing sub-line 103d are arranged at different layers. It is deemed that the cut-off point A is arranged between the adjacent testing sub-lines at different layers, and the conductive contacts 105 extending to the upper surface S of the array substrate are arranged at two sides of the cut-off point A.

It should be appreciated that, the testing sub-lines may be arranged in various modes. For example, when there are five testing sub-lines, three of them may be arranged at a layer identical to the gate line pattern, and two of them may be arranged at a layer identical to the source-drain electrode layer. The arrangement mode of the testing sub-lines is not particularly defined herein.

It should be further appreciated that, according to the array substrate in the embodiments of the present disclosure, through the cut-off point at the midpoint of the at least one testing line, it is able to segment the at least one testing line into two testing sub-lines with an identical length, so as to remarkably attenuate the antenna effect generated by the testing line through only one cut-off point.

It should be further appreciated that, according to the array substrate in the embodiments of the present disclosure, through the cut-off points arranged at two ends of the at least one testing line, it is able to separate the testing line from the operating circuit, so as to prevent the charges accumulated in the testing line from being introduced into the operating circuit.

In a word, according to the array substrate in the embodiments of the present disclosure, when forming each testing line, each testing line is provided with at least one cut-off point in such a manner that the segmented testing sub-lines are each not too long. As a result, it is able to attenuate an antenna effect generated when the testing line is too long, thereby to prevent the operating circuits from being damaged when too many charges are accumulated at the elongate testing lines due to the antenna effect.

Figure 6:
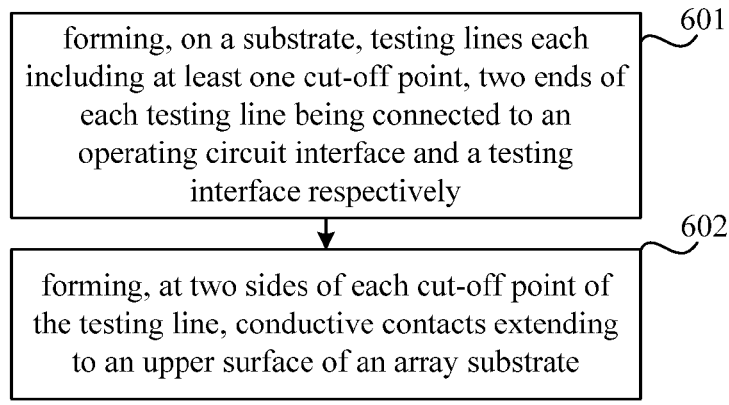
FIG. 6 is a flow chart of a method for manufacturing array substrates according to one embodiment of the present disclosure.

As shown in FIG. 6, which is a flow chart of a method for manufacturing the array substrate, the method may include following steps.

Step 601: forming, on a substrate, testing lines each including at least one cut-off point, two ends of each testing line being connected to an operating circuit interface and a testing interface, respectively.

Step 602: forming, at two sides of each cut-off point of each testing line, conductive contacts extending to an upper surface of the array substrate.

When testing an operating circuit, the conductive contacts at two sides of each cut-off point are electrically connected to each other, so as to eclectically connect the testing sub-lines of each testing line.

According to the method for manufacturing the array substrate in the embodiments of the present disclosure, when forming each testing line, each testing line is provided with at least one cut-off point in such a manner that the segmented testing sub-lines are each not too long. As a result, it is able to attenuate an antenna effect generated when the testing line is too long, thereby to prevent the operating circuits from being damaged when too many charges are accumulated at the elongate testing lines due to the antenna effect.

Figure 7:
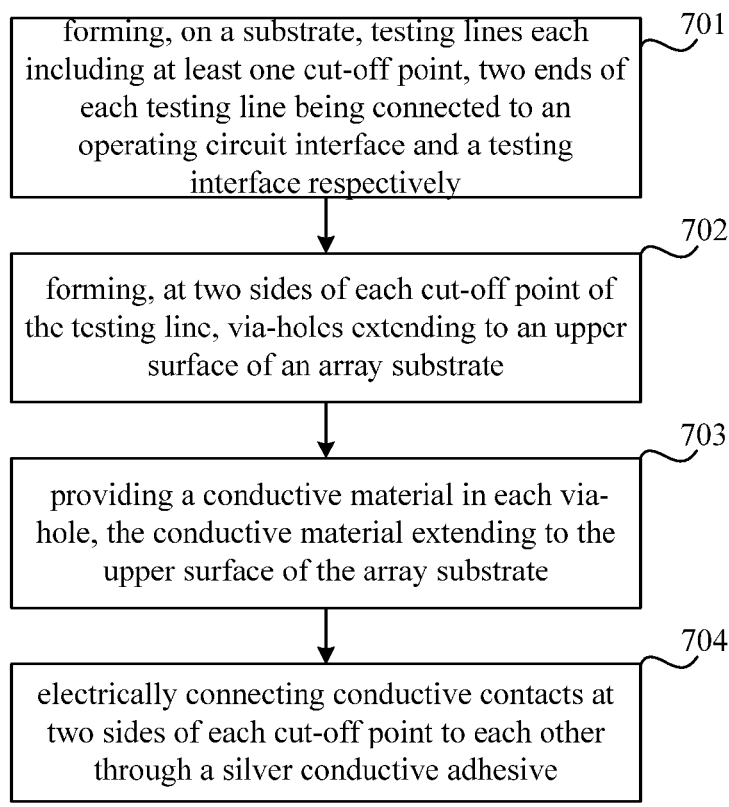
FIG. 7 is another flow chart of a method for manufacturing array substrates according to one embodiment of the present disclosure.

As shown in FIG. 7, which is another flow chart of the method for manufacturing the array substrate, the method may include the following steps.

Step 701: forming, on a substrate, testing lines each including at least one cut-off point, two ends of each testing line being connected to an operating circuit interface and a testing interface, respectively.

At first, the testing lines each including at least one cut-off point may be formed on the substrate, and two ends of each testing line are connected to the operating circuit interface and the testing interface, respectively. At least one of the testing lines includes a cut-off point at its midpoint, i.e., the at least one testing line is segmented by the cut-off point into two testing sub-lines with an identical length, so as to remarkably attenuate the antenna effect generated by the testing line through only one cut-off point. Alternatively, at least one of the testing lines includes the cut-off points at two ends, i.e., the testing line is separated from the operating circuit through the cut-off points, so as to prevent the charges accumulated in the testing line from being introduced into the operating circuit. A distance between the conductive contacts at two sides of each cut-off point is greater than 5 µm.

Alternatively, the operating circuit interfaces include an operating circuit interface at a display region and an operating circuit interface at a peripheral region, the testing interfaces include a testing interface at the display region and a testing interface at the peripheral region, and the testing lines include a testing line at the display region and a testing line at the peripheral region. To be specific, the testing line at the display region connects the operating circuit interface at the display region to the testing interface at the display region, and the testing line at the peripheral region connects the operating circuit interface at the peripheral region to the testing interface at the peripheral region. It should be appreciated that, the position of the testing interface is not particularly defined herein, and during the actual application, its position is adjustable.

In addition, depending on different positions of the testing lines, there may exist the following three situations for Step 701.

Figure 8:
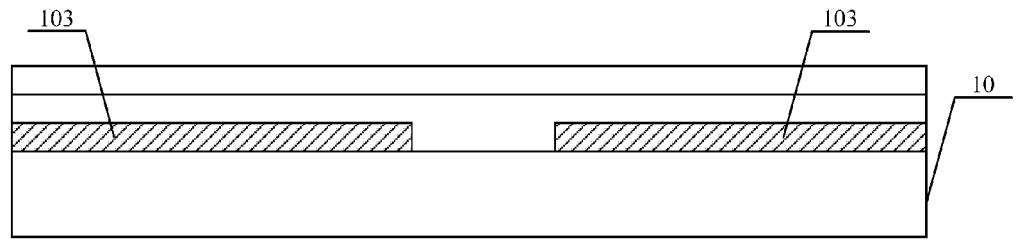
FIGS. 8-14 are schematic views showing a substrate in FIG. 7.

In a first situation, forming, on the substrate, the testing lines each including at least one cut-off point and a gate electrode pattern, and then forming any other desired films and patterns (e.g., an insulation layer, a source-drain electrode pattern and a protection layer) on the substrate with the testing lines and the gate electrode pattern. FIG. 8 shows the structure of the array substrate in this situation (where no gate electrode pattern is shown), and the testing lines 103 are formed on the substrate 10.

Figure 9:
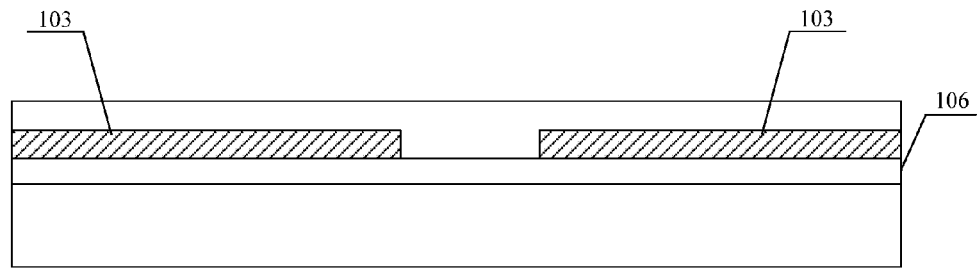

In a second situation, forming, on the substrate with an insulation layer, the testing lines each including at least one cut-off point and a source-drain electrode pattern, and then forming any other desired films and patterns (e.g., a protection layer) on the substrate with the testing lines and the source-drain electrode pattern. FIG. 9 shows the structure of the array substrate in this situation (where no gate electrode pattern is shown), and the testing lines 103 are formed on the insulation layer 106.

Figure 10:
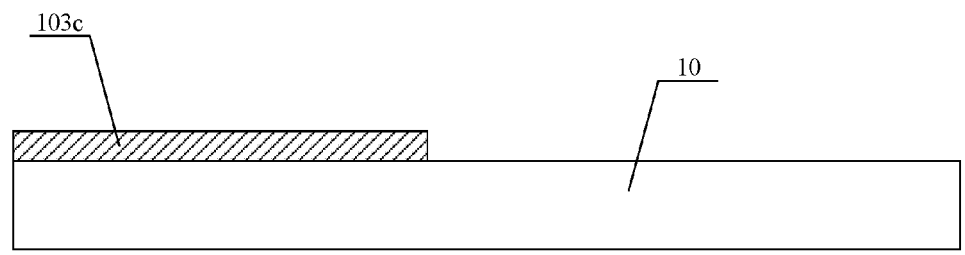
Figure 11:
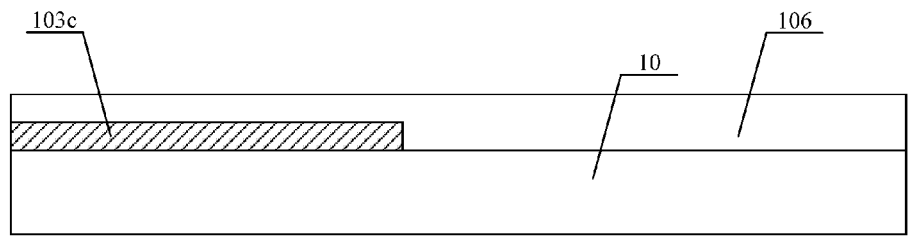
Figure 12:
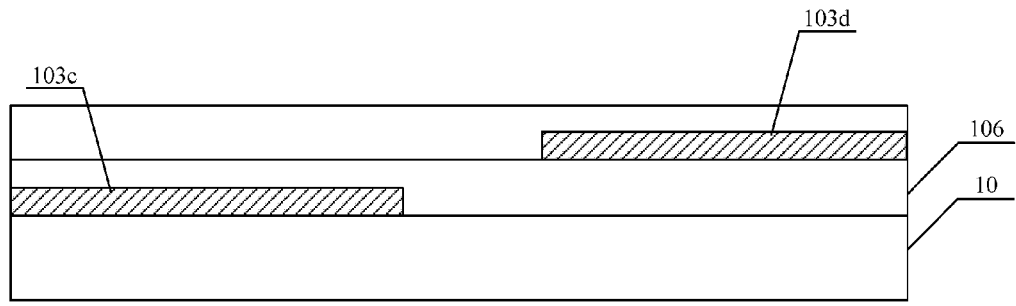

In a third situation, a sub-step (1) of forming, on the substrate 10, a first testing sub-line pattern 103c and a gate electrode pattern (FIG. 10 shows the resultant substrate, without the gate electrode pattern); a sub-step (2) of forming, on the substrate 10 with the first testing sub-line pattern 103c and the gate electrode pattern, an insulation layer 106 (FIG. 11 shows the resultant substrate, without the gate electrode); and a sub-step (3) of forming, on the substrate 10 with the insulation layer 106, a second testing sub-line pattern and a source-drain electrode pattern, the first testing sub-line pattern and the second testing sub-line pattern being formed together as the testing line including at least one cut-off point, and then forming any other desired films and patterns (e.g., a protection layer) on the substrate with the testing lines and the source-drain electrode pattern (FIG. 12 shows the resultant substrate, without the gate electrode pattern and the source-drain electrode pattern). The first testing sub-line 103c is formed on the substrate 10, and the second testing sub-line 103d is formed on the insulation layer 106.

Step 702: forming, at two sides of each cut-off point of the testing line, via-holes extending to an upper surface of the array substrate.

Figure 13:
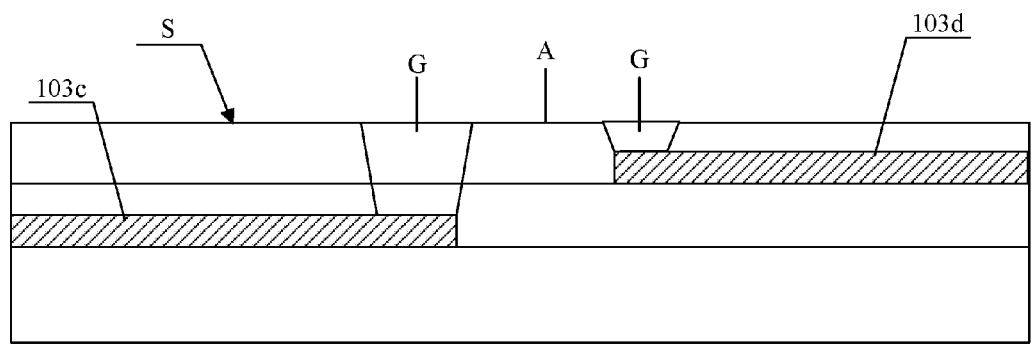

After the desired films and patterns are formed, the via-holes extending to the upper surface of the array substrate may be formed at two sides of each conductive contact of the testing line, e.g., by a patterning process. Taking the third situation as an example, FIG. 13 shows the resultant substrate after Step 702, where the via-holes G extend from the either side of the cut-off point A to the upper surface S of the array substrate, and the first testing sub-line 103c and the second testing sub-line 103d are arranged at different layers.

Step 703: providing a conductive material in each via-hole, the conductive material extending to the upper surface of the array substrate.

Figure 14:
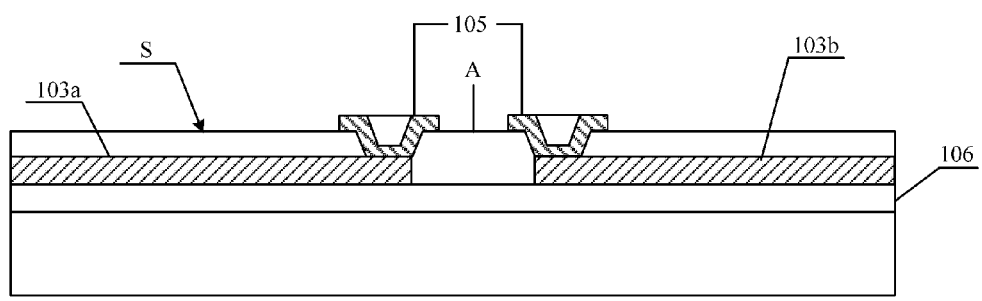

After the via-holes are formed in the array substrate, the conductive material may be provided in the via-holes, e.g., by a patterning process, and extend to the upper surface of the array substrate. The conductive material is used to electrically connect the testing sub-lines separated by each cut-off point. Taking the third situation as an example, FIG. 5 shows the resultant substrate after Step 703. In addition, taking the first situation as an example, FIG. 4 shows the resultant substrate after Step 703, and taking the second situation as an example, FIG. 14 shows the resultant substrate after Step 703. The testing sub-line 103a and the testing sub-line 103b are arranged on the insulation layer 106, and the conductive contacts 105 extending to the upper surface S of the array substrate are arranged at two sides of each cut-off point.

Step 704: electrically connecting the conductive contacts at two sides of each cut-off point to each other through a silver conductive adhesive.

When it is necessary to test the operating circuit on the array substrate, the conductive contacts at two sides of each cut-off point may be electrically connected to each other through a silver conductive adhesive. It should be appreciated that, when the operating circuit at the display region is to be tested, merely the conductive contacts at two sides of the cut-off point of the testing line at the display region may be electrically connected to each other, and when the operating circuit at the peripheral region is to be tested, merely the conductive contacts at two sides of the cut-off point of the testing line at the peripheral region may be electrically connected to each other.

It should be further appreciated that, according to the method for manufacturing the array substrate in the embodiments of the present disclosure, through the cut-off point at the midpoint of the at least one testing line, it is able to segment the at least one testing line into two testing sub-lines with an identical length, so as to remarkably attenuate the antenna effect generated by the testing line through only one cut-off point.

It should be further appreciated that, according to the method for manufacturing the array substrate in the embodiments of the present disclosure, through the cut-off points arranged at two ends of the at least one testing line, it is able to separate the testing line from the operating circuit, so as to prevent the charges accumulated in the testing line from being introduced into the operating circuit.

In a word, according to the method for manufacturing the array substrate in the embodiments of the present disclosure, when forming each testing line, each testing line is provided with at least one cut-off point in such a manner that the segmented testing sub-lines are each not too long. As a result, it is able to attenuate an antenna effect generated when the testing line is too long, thereby to prevent the operating circuits from being damaged when too many charges are accumulated at the elongate testing lines due to the antenna effect.

The present disclosure further provides in some embodiments a display device including the above-mentioned array substrate, e.g., the array substrate in FIG. 1 or FIG. 3.

The above are merely the preferred embodiments of the present disclosure. It should be appreciated that, a person skilled in the art may make further modifications and improvements without departing from the principle of the present disclosure, and these modifications and improvements shall also fall with the scope of the present disclosure.

What is claimed is:

1. An array substrate, comprising:
   operating circuit interfaces;
   testing interfaces; and
   testing lines connecting the operating circuit interfaces and the testing interfaces;
   wherein each testing line comprises at least one cut-off point, and conductive contacts extending to an upper surface of the array substrate are arranged at two sides of each cut-off point of the testing line;
   wherein the conductive contacts at the two sides of each cut-off point are separated and electrically insulated from each other.

2. The array substrate according to claim 1, wherein at least one of the testing lines comprises a cut-off point at its midpoint.

3. The array substrate according to claim 2, wherein at least one of the testing lines comprises cut-off points at its two ends.

4. The array substrate according to claim 1, wherein the conductive contact is a via-hole extending from one side of the cut-off point to the upper surface of the array substrate, and a conductive material is arranged in the via-hole and extends to the upper surface of the array substrate.

5. The array substrate according to claim 4, wherein a distance between the conductive contacts at two sides of each cut-off point is greater than 5 μm.

6. The array substrate according to claim 1, wherein each testing line is segmented by the at least one cut-off point into a plurality of testing sub-lines arranged at an identical layer or at different layers of the array substrate.

7. The array substrate according to claim 1, wherein the operating circuit interfaces comprise an operating circuit interface at a display region and an operating circuit interface at a peripheral region;
   the testing interfaces comprise a testing interface at the display region and a testing interface at the peripheral region;
   the testing lines comprise a testing line at the display region and a testing line at the peripheral region;
   the testing line at the display region connects the operating circuit interface at the display region to the testing interface at the display region, and
   the testing line at the peripheral region connects the operating circuit interface at the peripheral region to the testing interface at the peripheral region.

8. A method for manufacturing an array substrate according to claim 1, comprising steps of:
   forming, on a substrate, testing lines each including at least one cut-off point, two ends of each testing line being connected to an operating circuit interface and a testing interface, respectively; and
   forming, at two sides of each cut-off point of the testing line, conductive contacts extending to an upper surface of the array substrate in such a manner that the conductive contacts at the two sides of each cut-off point are separated and electrically insulated from each other.

9. The method according to claim 8, wherein at least one of the testing lines comprises a cut-off point at its midpoint.

10. The method according to claim 9, wherein at least one of the testing lines comprises cut-off points at its two ends.

11. The method according to claim 8, wherein each conductive contact is a via-hole in which a conductive material is provided, and
    the step of forming, at two sides of each cut-off point of each testing line, the conductive contacts extending to the upper surface of the array substrate comprises:
    forming, at two sides of each cut-off point of each testing line, the via-holes extending to the upper surface of the array substrate; and
    providing the conductive material in each via-hole, the conductive material extending to the upper surface of the array substrate.

12. The method according to claim 11, wherein a distance between the conductive contacts at two sides of each cut-off point is greater than 5 μm.

13. The method according to claim 8, wherein the step of forming, on the substrate, the testing lines each including at least one cut-off point comprises:
    forming, on the substrate, the testing lines each including at least one cut-off point and a gate electrode pattern;
    or, forming, on the substrate with an insulation layer, the testing lines each including at least one cut-off point and a source-drain electrode pattern.

14. The method according to claim 8, wherein the step of forming, on the substrate, the testing lines each including at least one cut-off point comprises:
    forming, on the substrate, a first testing sub-line pattern and a gate electrode pattern;
    forming, on the substrate with the first testing sub-line pattern and the gate electrode pattern, an insulation layer; and
    forming, on the substrate with the insulation layer, a second testing sub-line pattern and a source-drain electrode pattern, the first testing sub-line pattern and the second testing sub-line pattern being formed together as the testing line including at least one cut-off point.

15. The method according to claim 8, wherein the operating circuit interfaces comprise an operating circuit interface at a display region and an operating circuit interface at a peripheral region;
    the testing interfaces comprise a testing interface at the display region and a testing interface at the peripheral region;
    the testing lines comprise a testing line at the display region and a testing line at the peripheral region;
    the testing line at the display region connects the operating circuit interface at the display region to the testing interface at the display region; and
    the testing line at the peripheral region connects the operating circuit interface at the peripheral region to the testing interface at the peripheral region.

16. A display device comprising an array substrate;
    wherein the array substrate comprises:
    operating circuit interfaces;
    testing interfaces; and
    testing lines connecting the operating circuit interfaces and the testing interfaces;
    wherein each testing line comprises at least one cut-off point, and conductive contacts extending to an upper surface of the array substrate are arranged at two sides of each cut-off point of the testing line;
    wherein the conductive contacts at the two sides of each cut-off point are separated and electrically insulated from each other.

17. The display device according to claim 16, wherein at least one of the testing lines comprises a cut-off point at its midpoint.

18. The display device according to claim 16, wherein at least one of the testing lines comprises cut-off points at its two ends.

19. The array substrate according to claim 1, wherein the conductive contacts at the two sides of each cut-off point are separated from each other by a distance that is greater than 5 μm.

20. The method according to claim 8, wherein the conductive contacts at the two sides of each cut-off point are separated from each other by a distance that is greater than 5 μm.

* * * * *